(12) United States Patent
Cho et al.

(10) Patent No.: US 11,158,732 B2
(45) Date of Patent: Oct. 26, 2021

(54) ONE-TRANSISTOR DRAM CELL DEVICE HAVING QUANTUM WELL STRUCTURE

(71) Applicant: Gachon University of Industry-Academic cooperation Foundation, Seongnam-si (KR)

(72) Inventors: Seongjae Cho, Seoul (KR); EunSeon Yu, Seoul (KR); Jae Yoon Lee, Seoul (KR)

(73) Assignee: Gachon University of Industry-Academic cooperation Foundation

( * ) Notice: Subject to any disclaimer, the term of this patent is extended or adjusted under 35 U.S.C. 154(b) by 0 days.

(21) Appl. No.: 16/660,203

(22) Filed: Oct. 22, 2019

(65) Prior Publication Data
US 2020/0135905 A1 Apr. 30, 2020

(30) Foreign Application Priority Data
Oct. 24, 2018 (KR) .......................... 10-2018-0127746

(51) Int. Cl.
| | |
|---|---|
| *H01L 29/78* | (2006.01) |
| *H01L 29/66* | (2006.01) |
| *H01L 27/108* | (2006.01) |
| *H01L 29/12* | (2006.01) |
| *H01L 29/165* | (2006.01) |

(52) U.S. Cl.
CPC ...... *H01L 29/66977* (2013.01); *H01L 27/108* (2013.01); *H01L 29/122* (2013.01); *H01L 29/165* (2013.01); *H01L 29/7827* (2013.01); *H01L 29/7831* (2013.01)

(58) Field of Classification Search
CPC ............. H01L 29/66977; H01L 27/108; H01L 29/122; H01L 29/165; H01L 29/7827; H01L 29/7831; H01L 27/10805; H01L 27/11273; H01L 27/11553; H01L 27/1158
See application file for complete search history.

(56) References Cited

U.S. PATENT DOCUMENTS

| | | | | |
|---|---|---|---|---|
| 9,287,362 B1 * | 3/2016 | Basu | ................. | H01L 29/66977 |
| 10,580,770 B2 * | 3/2020 | Miao | ................. | H01L 29/66666 |

(Continued)

FOREIGN PATENT DOCUMENTS

| | | |
|---|---|---|
| KR | 10-1085155 | 11/2011 |
| KR | 10-1835611 | 3/2018 |

*Primary Examiner* — Bitew A Dinke
(74) *Attorney, Agent, or Firm* — Gerald E. Hespos; Michael J. Porco; Matthew T. Hespos

(57) ABSTRACT

A 1T DRAM cell device having two or more heterojunction surfaces perpendicular to the channel length direction and a quantum well at the drain region side. The 1T DRAM cell device described herein may be driven by GIDL or band-to-band tunneling, so that low voltage and high speed operation can be performed, and retention time and read current margin can be dramatically increased. It can also be driven as a memory device in harsh environments with high temperatures. Furthermore, since the heterojunction surfaces can be formed by vertically stacking epitaxial layers on a semiconductor substrate such as silicon, the conventional CMOS process technology can be used, and the area occupied by the device can be reduced as much as possible without limiting the channel length.

2 Claims, 9 Drawing Sheets

(56) References Cited

U.S. PATENT DOCUMENTS

| | | | |
|---|---|---|---|
| 2002/0028541 A1* | 3/2002 | Lee | H01L 27/11556 438/149 |
| 2004/0157353 A1* | 8/2004 | Ouyang | H01L 29/1054 438/38 |
| 2004/0256639 A1* | 12/2004 | Ouyang | H01L 29/7789 257/202 |
| 2005/0280156 A1* | 12/2005 | Lee | H01L 23/48 257/758 |
| 2008/0303083 A1* | 12/2008 | Oyu | H01L 29/66787 257/329 |
| 2011/0260259 A1* | 10/2011 | Masuoka | H01L 27/092 257/369 |
| 2012/0319201 A1* | 12/2012 | Sun | H01L 29/7827 257/338 |
| 2013/0026562 A1* | 1/2013 | Beigel | H01L 29/0638 257/334 |
| 2014/0166981 A1* | 6/2014 | Doyle | H01L 29/7827 257/24 |
| 2015/0048293 A1* | 2/2015 | Park | H01L 29/78 257/2 |
| 2015/0091058 A1* | 4/2015 | Doyle | H01L 29/7391 257/192 |
| 2015/0155283 A1* | 6/2015 | Gupta | H01L 27/1023 257/133 |
| 2016/0149050 A1* | 5/2016 | Basu | H01L 29/66553 257/192 |
| 2019/0245096 A1* | 8/2019 | Ramaswamy | H01L 21/02667 |
| 2020/0152790 A1* | 5/2020 | Miao | H01L 29/0657 |

* cited by examiner

ONE-TRANSISTOR DRAM CELL DEVICE HAVING QUANTUM WELL STRUCTURE

CROSS-REFERENCE TO RELATED APPLICATION

This application claims priority to Korean Patent Application No. 10-2018-0127746, filed on Oct. 24, 2018, under 35 U.S.C. 119, the entire contents of which are hereby incorporated by reference.

BACKGROUND

Field of the Invention. The present invention relates to a semiconductor memory device, and more particularly to a one-transistor dynamic random access memory (1T DRAM) cell device having a quantum-well structure by heterojunction without a capacitor.

Related Art. Currently, a unit cell of DRAM is composed of one transistor and one capacitor (1T1C). The area occupied by the capacitor is very large compared to that of the transistor, and there is a big limitation in scaling the capacitor due to the charge sharing effect.

Therefore, DRAM scaling is being made in the direction of developing a high dielectric constant insulator for a capacitor and increasing the aspect ratio of the capacitor. However, there are several difficulties in capacitor scaling because the number of materials that can be integrated with silicon (Si) is limited, research time and data accumulation for new materials are needed, and high-level process technology is required. These difficulties hinder the scaling of DRAM.

In order to solve these issues of capacitor scaling, a capacitor-less 1T DRAM device was first proposed in 2001 and has been continuously studied ever since. Among them, there are However, the 1T DRAM devices proposed so far have similar or more deteriorated characteristics than the conventional 1T1C cells in terms of retention time and read current margin, which are important indicators of DRAM cell characteristics. In addition, since most devices are based on SOI substrates and have difficulty in reducing cell size, there are many limitations in replacing the conventional DRAM.

SUMMARY

The present invention provides a 1T DRAM cell device having a quantum-well structure to solve the problems of the conventional 1T DRAM device. Particularly, it is to be manufactured by using the conventional CMOS technology on bulk silicon substrate. By forming a quantum well in the drain side of the channel with a heterojunction vertically and by using it as a charge storage layer, there is less restriction in the channel length, and the area occupied by the device can be more reduced than present. The write operation can be performed by gate-induced drain leakage (GIDL) or band-to-band tunneling, which enables low-power and high-speed operation capabilities, and dramatically improves retention time and read current margin.

To achieve the objectives, a 1T DRAM cell device according to the present invention comprises a body region connecting a source and drain regions and storing charges, and one or more gates formed on the body region with a gate insulating layer interposed between the gates and the body region. The body region has a first heterojunction surface formed between a first semiconductor layer and a second semiconductor layer perpendicular to the channel length direction. At the meantime, the first semiconductor layer is formed as the same semiconductor material as that of the source region and has a homojunction with the source region. The second semiconductor layer is formed of a semiconductor material different from the drain region to be in contact with a second heterojunction surface perpendicular to the channel length direction, and wherein the charge is stored in a quantum well formed by the first heterojunction surface and the second heterojunction surface in the second semiconductor layer.

Here, the second semiconductor layer may have an energy band gap smaller than those of the first semiconductor layer and the drain region.

The first semiconductor layer may be formed to protrude vertically on the source region, and the second semiconductor layer and the drain region may be sequentially stacked on the first semiconductor layer.

The body region may have a polygonal pillar vertically stacked with the first semiconductor layer and the second semiconductor layer on the source region, and the gate may be two or more gates circumferentially spaced on the polygonal pillar.

The source region and the drain region may be horizontally spaced apart on the semiconductor substrate, and the first semiconductor layer and the second semiconductor layer may be horizontally formed between the source region and the drain region.

The source region and the drain region may be horizontally spaced apart on the semiconductor substrate, the body region may be a polygonal horizontal bar formed with the first semiconductor layer and the second semiconductor layer between the source region and the drain region, and the gate may be two or more gates circumferentially spaced on the polygonal horizontal bar.

The gate may be two or more gates covering the first heterojunction surface and the second heterojunction surface and spaced apart from the source region by a predetermined distance.

The first semiconductor layer may be a silicon layer having a conductivity type opposite to that of the source region, and the second semiconductor layer may be a silicon germanium layer doped with a higher concentration than the first semiconductor layer in the same conductivity type as the first semiconductor layer.

The silicon layer may be formed of a bulk silicon substrate together with the source region.

Another embodiment of the 1T DRAM device according to the present invention comprises a body region connecting a source region and a drain region and storing charge, and at least one gate formed on the body region with a gate insulating layer interposed therebetween, wherein the body region has a first semiconductor layer and a second semiconductor layer formed in a channel length direction with a first heterojunction surface, the first heterojunction surface being perpendicular to the channel length direction, wherein the first semiconductor layer is formed of the same semiconductor material as that of the source region and has a homojunction with the source region. The second semiconductor layer is formed of a semiconductor material different from the drain region to be in contact with a second heterojunction surface perpendicular to the channel length direction, wherein the charge is stored in a quantum well formed by the first heterojunction surface and the second heterojunction surface in the second semiconductor layer. The gate is two or more gates formed on the second semiconductor layer separated from the source region by the first semiconductor layer.

Another embodiment of the 1T DRAM device according to the present invention comprises a body region connecting a source region and a drain region and storing charge, and at least one gate formed on the body region with a gate insulating layer interposed therebetween. The body region has a first semiconductor layer and a second semiconductor layer formed in a channel length direction, the second semiconductor layer being inserted in the first semiconductor layer with a predetermined length from one side of the drain in the channel length direction and having a first heterojunction surface perpendicular to the channel length direction and one or more third heterojunction surfaces parallel to the channel length direction. The first semiconductor layer is formed of the same semiconductor material as that of the source region and has a homojunction with the source region, wherein the second semiconductor layer is formed of a semiconductor material different from the drain region to be in contact with a second heterojunction surface perpendicular to the channel length direction. The charge is stored in a quantum well formed by the first heterojunction surface, the second heterojunction surface and the third heterojunction surfaces in the second semiconductor layer.

Another embodiment of the 1T DRAM device according to the present invention comprises a body region connecting a source region and a drain region and storing charge, and at least one gate formed on the body region with a gate insulating layer interposed therebetween, wherein the body region has two or more heterojunction surfaces perpendicular to a channel length direction by repeatedly forming a first semiconductor layer and a second semiconductor layer alternately in heterojunction in the channel length direction, and wherein the source region and the drain region are formed of the same semiconductor material as the semiconductor layer in contact with one of the first semiconductor layer and the second semiconductor layer, respectively.

The semiconductor layer in contact with the drain region may be formed to have a thickness equal to or smaller than that of the gate insulating layer.

Another embodiment of the 1T DRAM device according to the present invention comprises a body region connecting a source region and a drain region and storing charge, and at least one gate formed on the body region with a gate insulating layer interposed therebetween, wherein the body region has a first semiconductor layer and a second semiconductor layer formed in a channel length direction with a first heterojunction surface, the first heterojunction surface being perpendicular to the channel length direction, wherein the second semiconductor layer is formed of a semiconductor material different from the drain region to be in contact with a second heterojunction surface perpendicular to the channel length direction, wherein the first semiconductor layer is formed of a semiconductor material different from the source region to be in contact with a third heterojunction surface perpendicular to the channel length direction, wherein the charge is stored in the quantum well formed by the first heterojunction surface and the second heterojunction surface in the second semiconductor layer, and wherein the gate is two or more gates formed on the second semiconductor layer separated from the source region by the first semiconductor layer.

The drain region may be formed of the same semiconductor material as that of the first semiconductor layer, and the second semiconductor layer may have an energy band gap smaller than those of the first semiconductor layer and the drain region.

The first semiconductor layer may have the same conductivity type as the source region.

The body region may have a square pillar vertically stacked with the first semiconductor layer and the second semiconductor layer on the source region, the gate may be four gates spaced on the square pillar, and at least one of the four gates may be a retaining gate in order to maintain the charges in the quantum well by applying a hold bias.

The first semiconductor layer may be a silicon carbon layer, and the second semiconductor layer may be a silicon layer having a conductivity type opposite to that of the first semiconductor layer.

In the present invention, by having two or more heterojunction surfaces perpendicular to the channel length direction and a quantum well at the drain side, the present invention can be driven by GIDL, band-to-band tunneling, and the like. It is possible to not only increase retention time, but also read current margin, and to operate as a memory device even in the harsh environment of high temperature.

In addition, since it is possible to form a heterojunction surface by vertically stacking epitaxial layers on a semiconductor substrate such as silicon, the conventional CMOS process technology can be used, and the area occupied by the device can be reduced as much as possible without limiting the channel length.

In these drawings, the following reference numbers are used throughout: reference number 10 indicates a source region, 20 and 23 a drain region, 30 a body region, 31a, 31b, 31c, 31d, 31e and 31f a heterojunction, 32 and 33 a first semiconductor layer, 34, 34a and 34b a second semiconductor layer, 42 and 44 a gate insulating film, and 52, 54, 56, and 58 a gate.

DETAILED DESCRIPTION

Detailed descriptions of preferred embodiments of the present invention are provided below with reference to accompanying drawings.

First Embodiment

Figure 1:
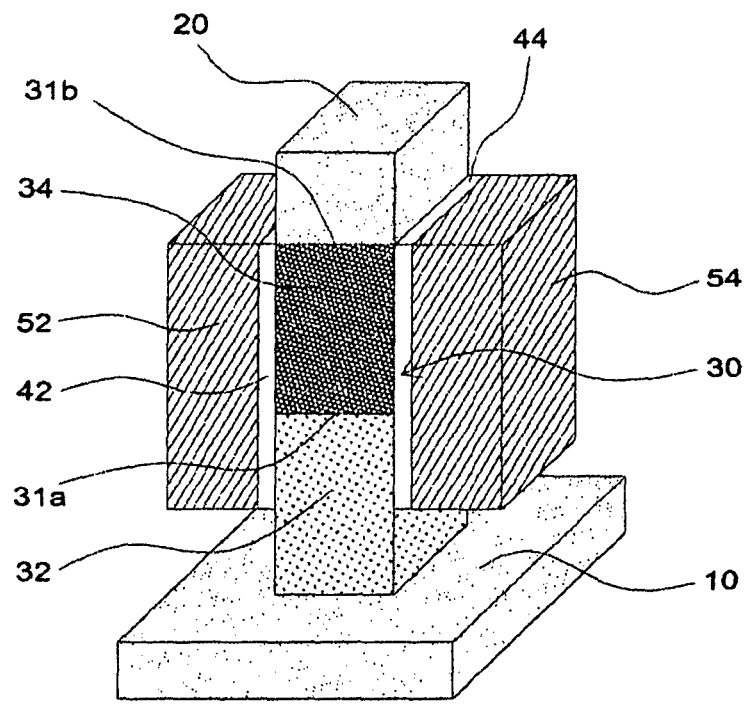
FIGS. 1 and 2 are a perspective view and a cross-sectional view showing the structure of a 1T DRAM cell device according to a first embodiment of the present invention.
Figure 2:
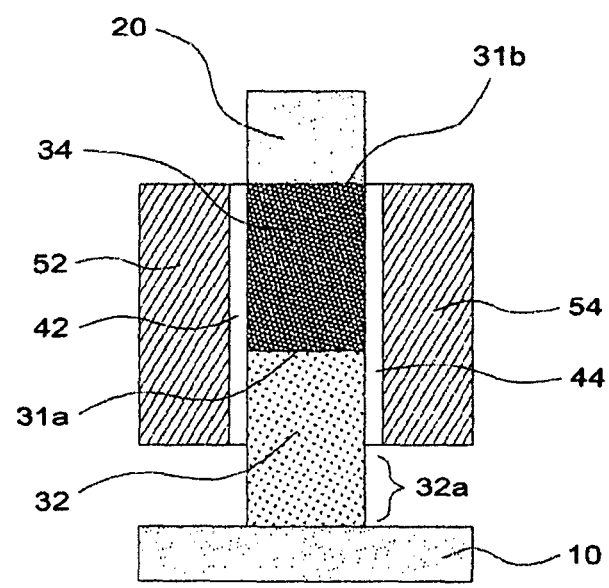

The 1T DRAM cell device according to the first embodiment of the present invention comprises, as shown in FIGS. 1 and 2, a body region 30 connecting a source region 10 and a drain region 20 and storing charge, and one or more gates 52 and 54 formed on the body region 30 with a gate insulating layer 42 or 44 interposed therebetween. Here, the body region 30 has a first semiconductor layer 32 and a second semiconductor layer 34 formed in a channel length direction with a first heterojunction surface 31$a$, and the first heterojunction surface 31$a$ is perpendicular to the channel length direction.

The first semiconductor layer 32 may be formed of the same semiconductor material as that of the source region. It may have a homojunction with the source region 10. The second semiconductor layer 34 may be formed of a semiconductor material different from the drain region 20 to be in contact with a second heterojunction surface 31$b$ perpendicular to the channel length direction.

The charge may be stored in a quantum well formed by the first heterojunction surface 31$a$ and the second heterojunction surface 31$b$ in the second semiconductor layer 34. Because the quantum well is formed adjacent to the drain region 20, it is possible to be driven by gate-induced drain leakage (GIDL), band-to-band tunneling, or the like, resulting in low-voltage and high-speed operation capabilities.

The quantum well is for accumulating carriers in the body region 30. In the present embodiment, the first and second heterojunction surfaces 31$a$ and 31$b$ formed perpendicular to the channel length direction are used for the quantum well. In order to form the quantum well, the second semiconductor layer 34 may have an energy band gap smaller than those of the first semiconductor layer 32 and the drain region 20. In particular, when the driving carriers of the device are electron and the excess carriers to be stored in the quantum well are hole, it is preferable to have a large valence-band offset (VBO) at both junctions of the second semiconductor layer 34 by properly selecting the material of the first and second semiconductor layers 32 and 34 and the drain 20.

If the above energy band gap conditions meet, any of the semiconductor material may be selected as the material of the first and second semiconductor layers 32 and 34. As a specific example, the first semiconductor layer 32 may be a silicon layer having a conductivity type opposite to that of the source region 10, and the second semiconductor layer 34 may be of the same conductivity type as the first semiconductor layer 32. It may be a silicon germanium layer doped at a higher concentration than the first semiconductor layer 32. The silicon layer, which is the first semiconductor layer 32, may be integrally formed on the bulk silicon substrate together with the source region 10.

Figure 9:
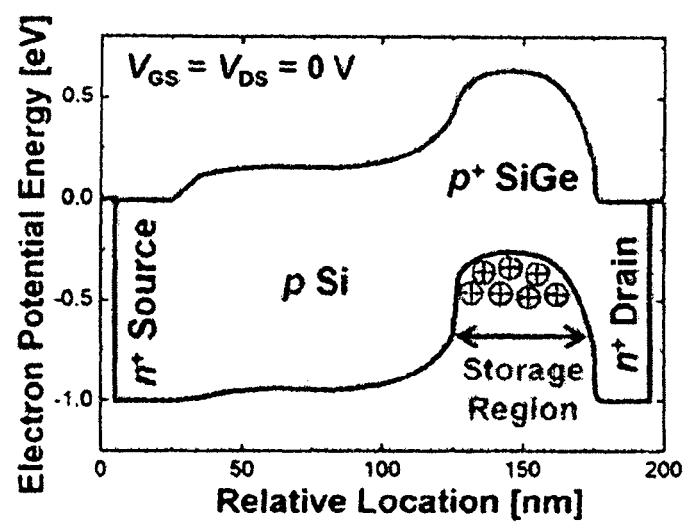
FIGS. 9 to 15 are electrical characteristic diagrams obtained as a result of the simulation of the structure of the 1T DRAM cell device shown in FIG. 1.

FIG. 9 shows an energy band diagram of a more specific embodiment, wherein the source region 10 may be an n+ silicon substrate, the first semiconductor layer 32 may be a p-type silicon layer, the second semiconductor layer 34 may be a p$^+$ silicon germanium layer, and the drain region 20 may be an n$^+$ silicon layer. In this embodiment a quantum well is formed as a hole storage region in a p$^+$ silicon germanium layer adjacent to the drain region 20.

In terms of structure, as shown in FIGS. 1 and 2, the first semiconductor layer 32 may be vertically protruded on the source region 10, and the second semiconductor layer 34 and the drain region 20 may be sequentially vertically stacked on the first semiconductor layer 32 by epitaxy or the like. By this embodiment, the conventional CMOS process technology can be used, the heterojunction surface perpendicular to the channel length direction can be easily formed, and the area occupied by the device can be reduced as much as possible without limiting the channel length.

Figure 6:
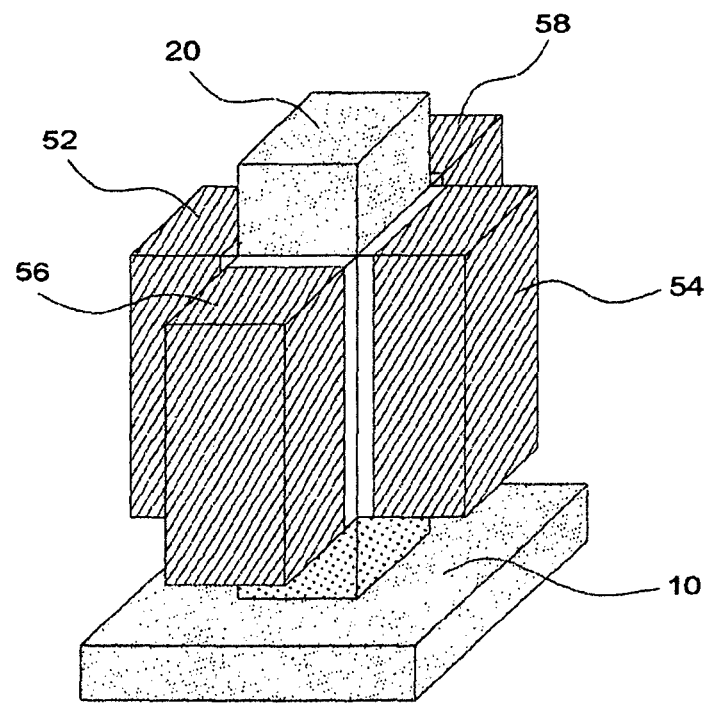
FIG. 6 is a cross-sectional view illustrating a structure of a 1T DRAM cell device according to a fifth embodiment of the present invention.

FIGS. 1 and 2 show an example in which two gates 52 and 54 are formed on both sides of the rectangular pillar-shaped body region 30 with the gate insulating layers 42 and 44 interposed therebetween, but not limited thereto. One gate (not shown) or four gates 52, 54, 56, and 58 may be formed, one on each side, as shown in FIG. 6.

In addition, the body region 30 is not limited to the quadrangular column shape, and the first semiconductor layer 32 and the second semiconductor layer 34 may be stacked vertically on the source region 10 in a polygonal column shape having three or more angles. It may be vertically stacked. At this time, the device has two or more gates circumferentially spaced on the polygonal pillar in the manner as shown in FIG. 6.

In the above embodiment, when two or more gates are formed, at least one of the gates may be used as a hold gate to which a hold voltage is applied for maintaining charges stored in the quantum well, thereby retention time and read current margin significantly increase. In addition, there is an advantage that can be driven as a memory device even in a harsh environment of high temperature.

Although not attached to the drawings, the body region 30 may be horizontally configured in the application of the above embodiment. For this configuration, the source region and the drain region may be horizontally spaced apart from the semiconductor substrate, and the first semiconductor layer and the second semiconductor layer may be formed horizontally between the source region and the drain region.

In this application example, the body region may be formed between the source region and the drain region with the first semiconductor layer and the second semiconductor layer in a polygonal horizontal bar shape, and the gate may be two or more gates circumferentially spaced on the polygonal horizontal bar.

In the above described embodiment, the gates 52 and 54 or 56 and 58 may cover (overlap) the first heterojunction surface 31$a$ and the second heterojunction surface 31$b$. It is preferable that one gate or two or more gates are formed at a position (underlapped position) away from the source region 10 by a predetermined distance 32$a$. Of course, the second heterojunction surface 31$b$ may be located on one side line of the gates 52 and 54 as shown in FIG. 2, but the second heterojunction surface 31$b$ may be preferably located inside the gates 52 and 54 so that the write voltage can be lowered when driving with GIDL or the like.

FIGS. 9 to 15 are electrical characteristic diagrams obtained as a result of the simulation of the structure of the IT DRAM cell device shown in FIG. 1.

Figure 10:
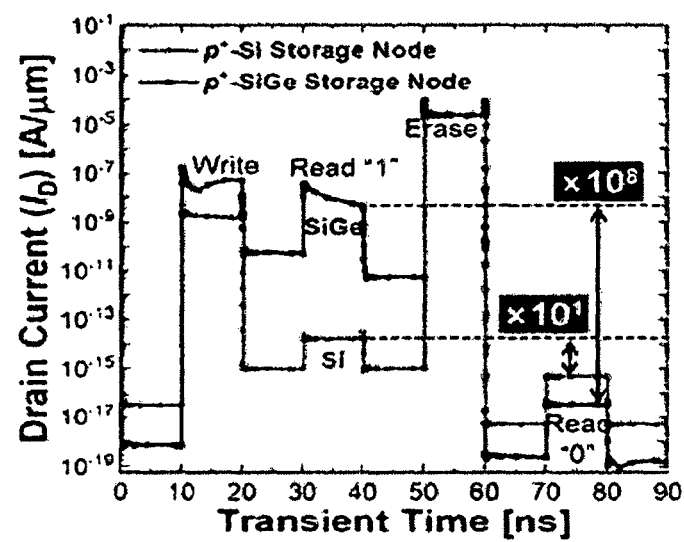

FIG. 9 is an energy band diagram expressed as electron potential energy according to a relative distance in a channel direction between a source region 10 and a drain region 20. FIG. 10 is an operation contrast diagram when the second semiconductor layer 34 at the drain side in which the quantum well is formed as the charge storage node is formed of silicon (Si) and is formed of silicon germanium (SiGe).

Referring to FIG. 9, a quantum well is formed in the second semiconductor layer 34 at the drain side with a large valence-band offset between Si and SiGe, and the data is stored in a manner which holes are trapped therein to influence channel potential. By using the quantum well for memory operation, the device can be stand-alone to improve the information retention time and read current margin which are one of the important performance indicators of DRAM. In FIG. 9, SiGe is $Si_{0.7}Ge_{0.3}$.

According to FIG. 10, when the second semiconductor layer 34 at the drain side is formed of SiGe to form a hole quantum well in SiGe, which is part of the channel, the read current after writing and erasing is $10^7$ times greater than in the case where all the channels are formed of Si.

Figure 11:
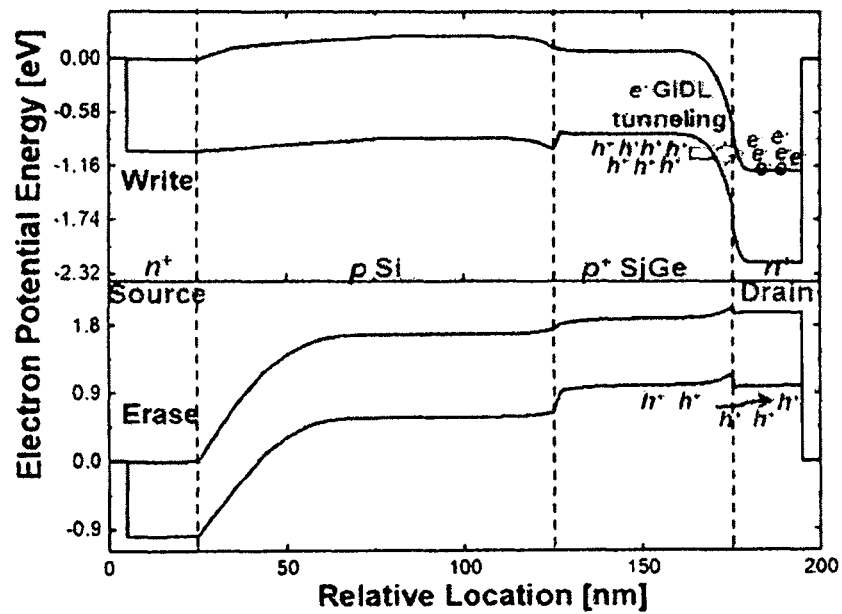
Figure 12:
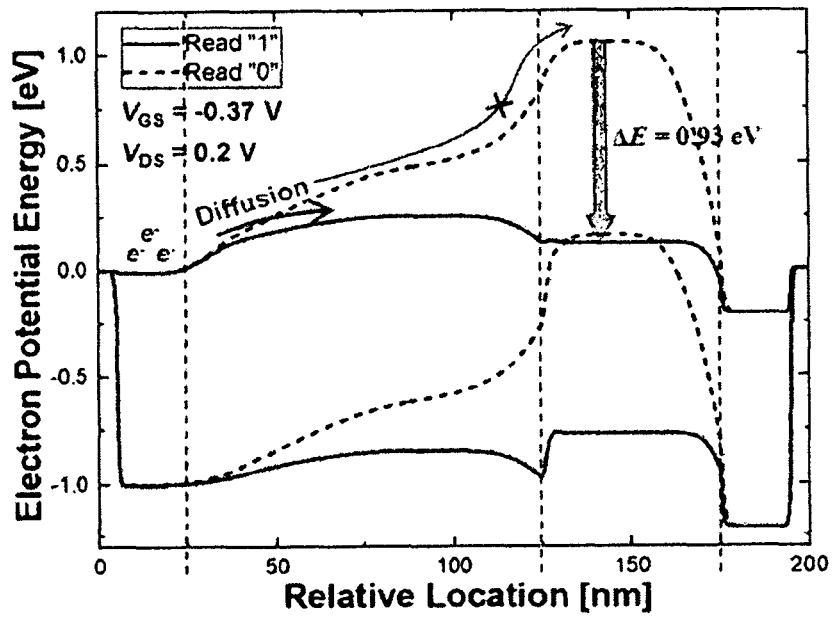

FIG. 11 shows energy band diagrams during write and erase operations, and FIG. 12 shows read operations when reading state 1 (Read "1", solid line) and when reading state 0 (Read "0", dashed line) in a contrast of energy bands.

Referring to FIG. 11, a depletion layer is formed on the second heterojunction surface 31b between p+ SiGe, which is the second semiconductor layer 34, and n+ Si, which is the drain region 20. Here, when a write voltage is applied to the source region 10 and the drain region 20 including the gates 52 and 54 (write operation), as shown in the upper energy band diagram of FIG. 11, electrons in the valence band of the p+ SiGe region 34 are tunneled to the vacancy in the conduction band of the n+ Si drain region 20, and holes are accumulated in the p+ SiGe region 34. The holes are trapped in a quantum well made of potential barriers of a valence-band offset (VBO) on the first heterojunction surface 31a and the second heterojunction surface 31b in the p+ SiGe region 34. It is saved as 'state 1'.

In the erase operation, as shown in the lower energy band diagram of FIG. 11, holes stored in the quantum well of the p+ SiGe region 34 are extracted to the drain region 20 through drift and diffusion to become 'state 0'.

The upper energy band diagram of FIG. 11 is a case where $V_{GS}$=−0.4 V, $V_{DS}$=1.2 V, and an application time of 5 ns as the write voltage in the structure of FIG. 9. Since the write voltage is enough to generate GIDL, low-voltage operation is possible. The lower energy band diagram of FIG. 11 shows a case where $V_{GS}$=0 V, $V_{DS}$=−2.0 V, and an application time of 5 ns as the erase voltage in the structure of FIG. 9.

According to FIG. 12, in a state in which holes are stored in the quantum well of the SiGe region 34 by the write operation (that is, state 1), the stored holes serve to apply a positive voltage to the channel region, and it makes the energy band of the SiGe region 34 be lowered (see solid line). That is, the energy band in the SiGe region 34 is lowered by up to 0.93 eV rather than the state when the holes stored in the quantum well of the SiGe region 34 are removed by the erase operation (that is, state 0 (see dashed line)).

Here, because of storing holes in the quantum well of the SiGe region 34, the energy bands are different between reading state 1 (Read "1") and reading state 0 (Read "0") at the same read voltage. As a result, the amount of drain current detected is changed, thereby distinguishing the storage state of the memory cell.

The energy band diagram of FIG. 12 is a case where $V_{GS}$=−0.37 V, $V_{DS}$=0.2 V, and an application time of 10 ns as the read voltage in the structure of FIG. 9.

Therefore, as shown in FIGS. 11 and 12, by varying the energy band in the SiGe region 34 to 0.93 eV as a maximum for states 1 and 0 even when the write voltage is at a low voltage, the read current margin can be significantly increased, which can be expected to be driven as a 1T DRAM device even in a harsh environment of high temperature, as described below.

Figure 13:
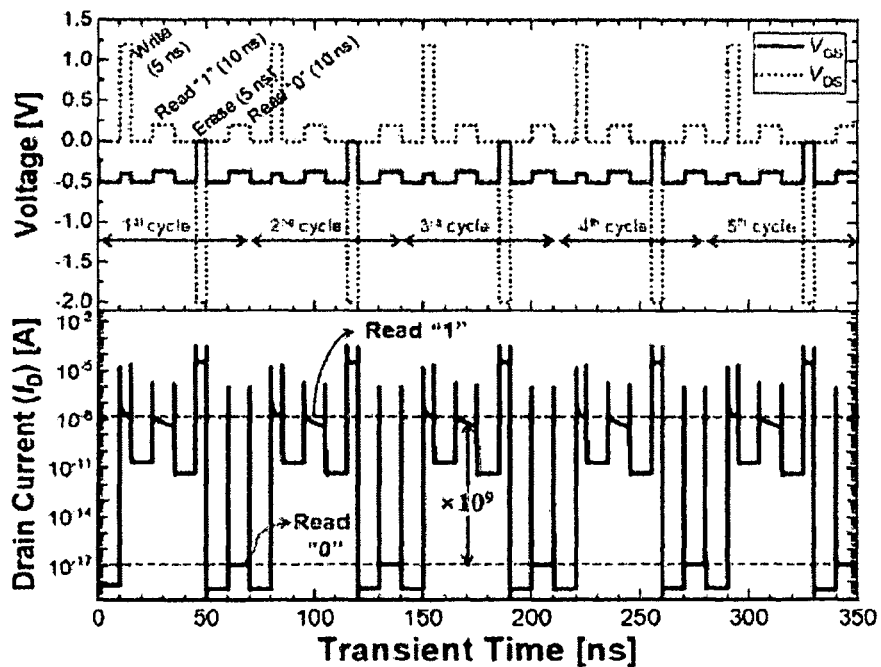

FIG. 13 shows the voltage application condition and drain current of each operation for 5 cycles when 8 operations such as write, hold, read, hold, erase, hold, read and hold are performed as one cycle in the structure of FIG. 9. According to FIG. 13, even though the write and erase operations are in 5 ns or in 10 ns or less, the read current ratio of the states 1 and 0 can be obtained with a large value of $10^9$, which enables not only low voltage driving but also high speed operation.

Figure 14:
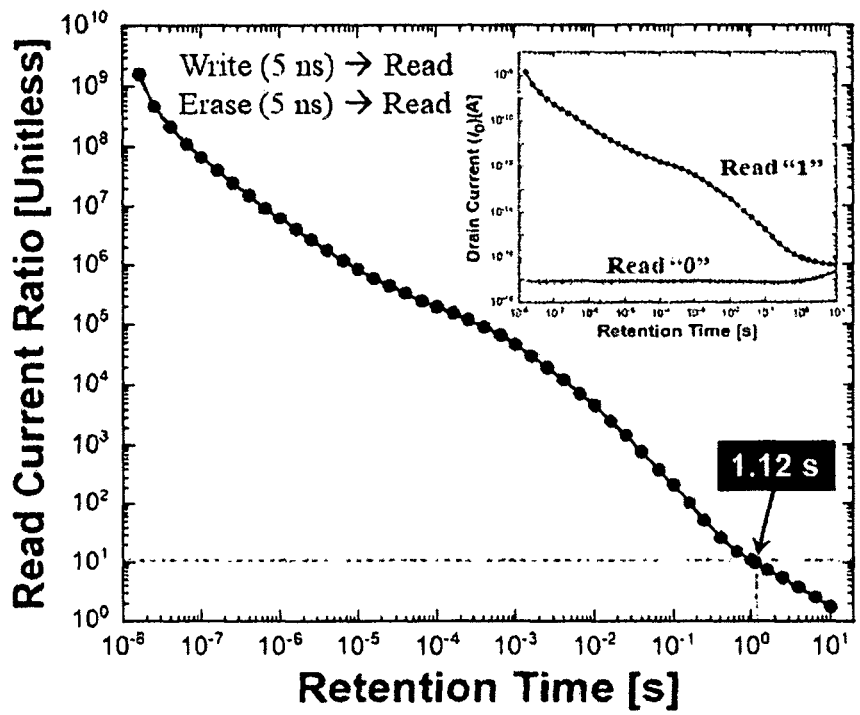

FIG. 14 is a retention time characteristic of the ratio between the read current (Read "1") of state 1 measured by repeating the read operation at regular intervals after the write operation and the read current (Read "0") of state 0 after the erase operation. According to this, it is maintained at $10^1$ times or more that is normally referred to for 1.12 seconds (s) or a long time. Accordingly, the structure of FIG. 9 can also improve retention characteristics, which are charge retention characteristics of quantum wells.

Figure 15:
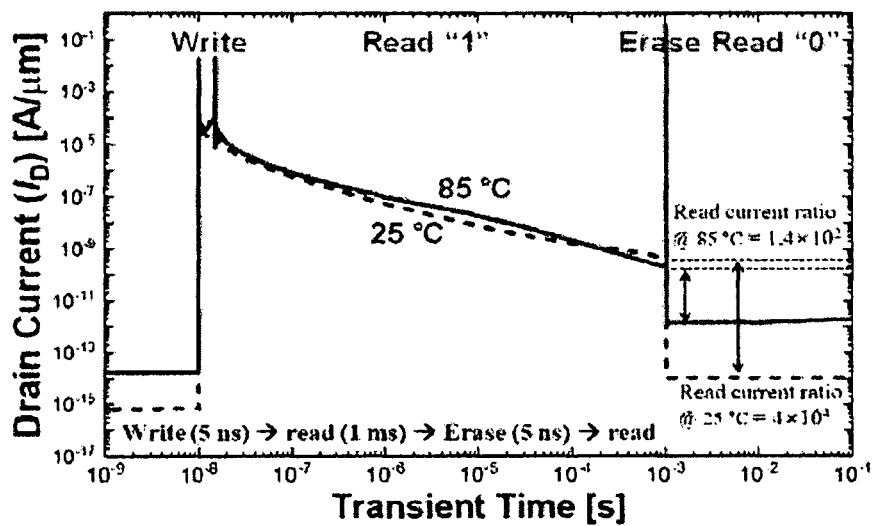

FIG. 15 is a comparison of characteristics according to the operating environments of the device having the structure of FIG. 9, which are measured and operated under the same conditions at 25° C. (dotted line) and 85° C. (solid line). According to this, there is almost no difference in Read "1" of both 25° C. (dotted line) and 85° C. (solid line), and it turns out that the difference remains in Read "0". As a result, the current ratio of both Read "1" and Read "0" is maintained at $10^2$ or more. It shows that the structure of FIG. 9 can be driven as a memory device in a state (i.e., state 1) that holes are stored in the quantum well by the write operation even if the device operation environment is poor at 85° C.

Second Embodiment

Figure 3:
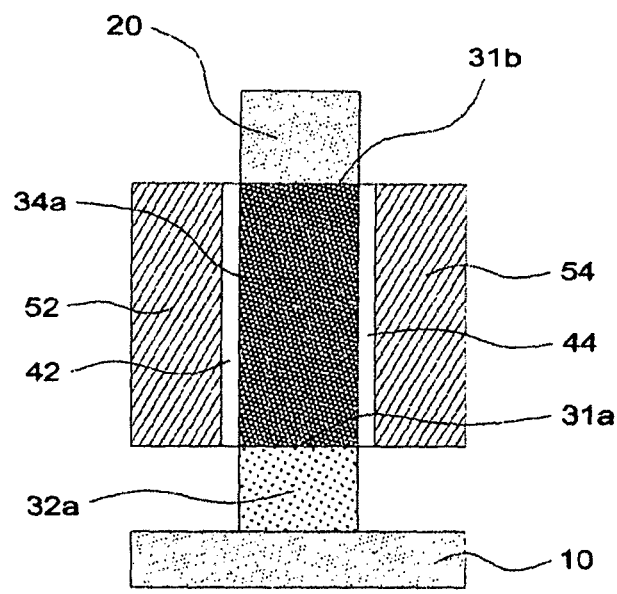
FIG. 3 is a cross-sectional view illustrating a structure of a 1T DRAM cell device according to a second embodiment of the present invention.

The 1T DRAM cell device according to the second embodiment of the present invention comprises, as shown in FIG. 3, a body region 30 connecting a source region 10 and a drain region 20 and storing charge, and one or more gates 52 and 54 formed on the body region 30 with a gate insulating layer 42 or 44 interposed therebetween. Here, the body region 30 has a first semiconductor layer 32 and a second semiconductor layer 34 formed in a channel length direction with a first heterojunction surface 31a, and the first heterojunction surface 31a is perpendicular to the channel length direction. Two or more gates 52 and 54 are formed on the second semiconductor layer 34a at a position spaced apart from the source region 10 by the first semiconductor layer 32a.

The rest of the configuration and application examples are the same as those of the first embodiment described above.

Third Embodiment

Figure 4:
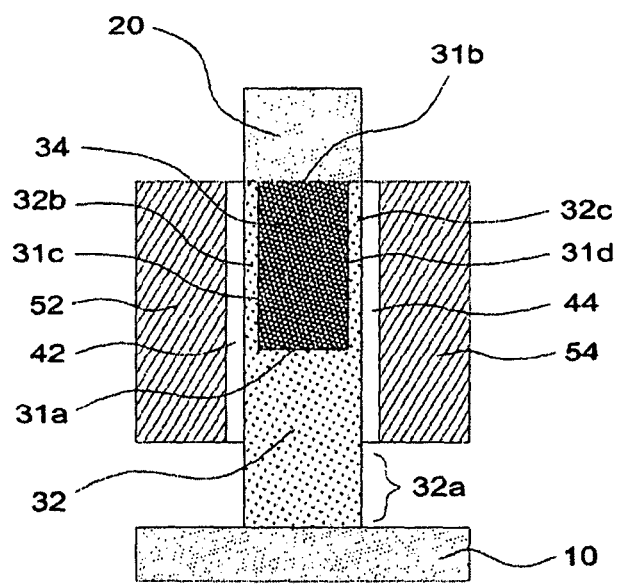
FIG. 4 is a cross-sectional view illustrating a structure of a 1T DRAM cell device according to a third embodiment of the present invention.

The 1T DRAM cell device according to the third embodiment of the present invention comprises, as shown in FIG. 4, a body region 30 connecting a source region 10 and a drain region 20 and storing charge, and one or more gates 52 and 54 formed on the body region 30 with a gate insulating layer 42 or 44 interposed therebetween. The body region 30 has a first semiconductor layer 32 and a second semiconductor layer 34 formed in a channel length direction, the second semiconductor layer 34 being inserted in the first semiconductor layer 32 with a predetermined length from one side of the drain 20 in the channel length direction and having a first heterojunction surface 31a perpendicular to the channel length direction and one or more third heterojunction surfaces 31c and 31d parallel to the channel length direction. The second semiconductor layer 34 is formed of a semiconductor material different from the drain region 20 to be in contact with a second heterojunction surface 31b perpendicular to the channel length direction. The charge is stored in a quantum well formed by the first heterojunction surface 31a, the second heterojunction surface 31b and the third heterojunction surfaces 31c and 31d in the second semiconductor layer 34.

Here, the third heterojunction surfaces 31c and 31d may be positioned below both surfaces of the first semiconductor layer 32 at a depth equal to or smaller than the thickness of the gate insulating layers 42 and 44 under each of the gates 52 and 54. The third heterojunction surfaces 31c and 31d may be one cylindrical or one polygonal shell in accordance with the side shape of body region 30.

The rest of the configuration and application examples are the same as those of the first embodiment described above.

Fourth Embodiment

Figure 5:
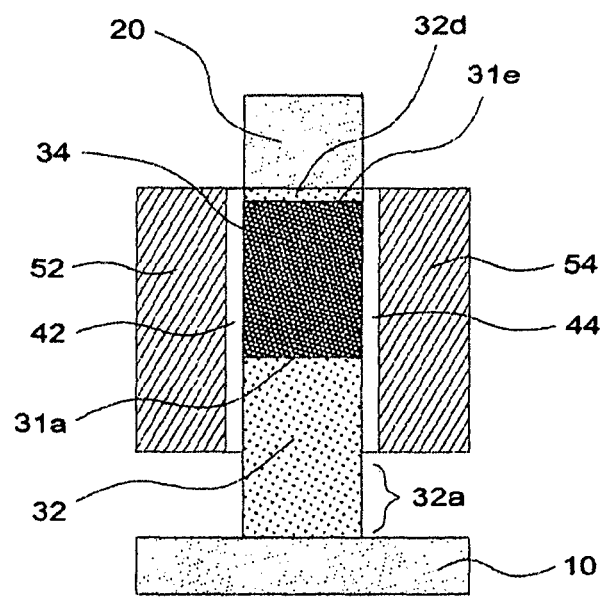
FIG. 5 is a cross-sectional view illustrating a structure of a 1T DRAM cell device according to a fourth embodiment of the present invention.

The 1T DRAM cell device according to the fourth embodiment of the present invention comprises, as shown in FIG. 5, a body region 30 connecting a source region 10 and a drain region 20 and storing charge, and one or more gates 52 and 54 formed on the body region 30 with a gate insulating layer 42 or 44 interposed therebetween. Here, the body region 30 has two or more heterojunction surfaces 31a and 31e perpendicular to a channel length direction by repeatedly forming a first semiconductor layer 32 and a second semiconductor layer 34 alternately in heterojunction in the channel length direction, and the source region 10 and the drain region 20 are formed of the same semiconductor material as the semiconductor layer in contact with one of the first semiconductor layer 32 and the second semiconductor layer 34, respectively.

In FIG. 5, the first semiconductor layer 32d is repeated once more on the second semiconductor layer 34 as the body region 30, but another second semiconductor layer (not shown) may be further disposed on the first semiconductor layer 32d, and may be further formed and alternately repeated to form a plurality of heterojunction surfaces 31a and 31e. In the same manner, the first semiconductor layer and the second semiconductor layer may be alternately further repeated to form a plurality of heterojunction surfaces 31a and 31e.

In this case, the semiconductor layer 32d in contact with the drain region 20 is preferably formed to have a thickness equal to or smaller than the thickness of the gate insulating layers 42 and 44, as shown in FIG. 5. By doing so, the heterojunction surface 31e adjacent to the drain region 20 is formed under the gates 52 and 54, so that the write voltage can be lowed when driving with GIDL or the like.

The rest of the configuration and application examples are the same as those of the first embodiment described above.

Fifth Embodiment

In the 1T DRAM cell device according to the fifth embodiment of the present invention, as shown in FIG. 6, the body region 30 of each of the above-described embodiments has a square pillar vertically stacked with the first semiconductor layer and the second semiconductor layer on the source region 10, the gate is four gates 52, 54, 56, and 58 circumferentially spaced on the square pillar, and at least one of the four gates 52, 54, 56, and 58 is a hold gate to apply a hold voltage for maintaining the charge in the quantum well. As mentioned in the first embodiment, the shape of the body region 30 is not limited to the square pillar shape, and the gate is not limited to four gates.

Because at least one of the four gates 52, 54, 56, and 58 may be used as a hold gate (i.e., a retention gate) to maintain the charge in the quantum well formed in the body region 30, it can dramatically increase retention time and read current margin, and can drive as a memory device even in harsh environments with high temperature.

The rest of the configuration and application examples are the same as those of the first embodiment described above.

Sixth Embodiment

Figure 7:
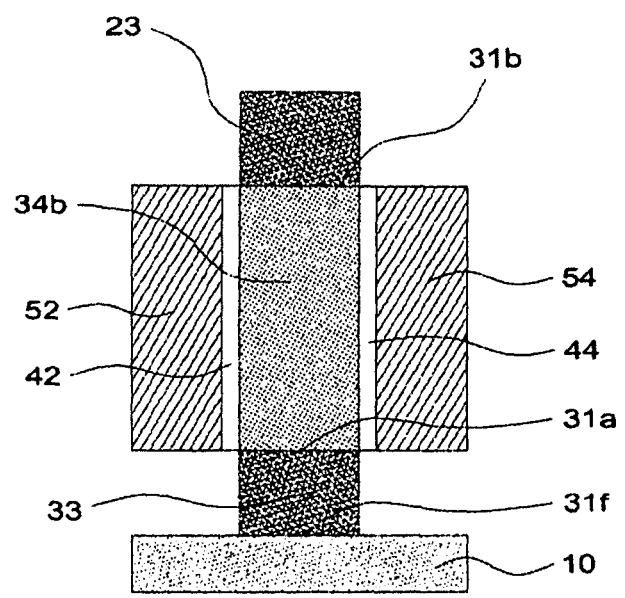
FIG. 7 is a cross-sectional view illustrating a structure of a 1T DRAM cell device according to a sixth embodiment of the present invention.

The 1T DRAM cell device according to the sixth embodiment of the present invention comprises, as shown in FIG. 7, a body region 30 connecting a source region 10 and a drain region 20 and storing charge, and one or more gates 52 and 54 formed on the body region 30 with a gate insulating layer 42 or 44 interposed therebetween. Here, the body region 30 has a first semiconductor layer 33 and a second semiconductor layer 34b formed in a channel length direction with a first heterojunction surface 31a, the first heterojunction surface 31a being perpendicular to the channel length direction. The second semiconductor layer 34b is formed of a semiconductor material different from the drain region 23 to be in contact with a second heterojunction surface 31b perpendicular to the channel length direction. The first semiconductor layer 33 is formed of a semiconductor material different from the source region 10 to be in contact with a third heterojunction surface 31f perpendicular to the channel length direction. The charge is stored in the quantum well formed by the first heterojunction surface 31a and the second heterojunction surface 31b in the second semiconductor layer 34b. And the gate is two or more gates 52 and 54 formed on the second semiconductor layer 34b separated from the source region 10 by the first semiconductor layer 33.

Here, the drain region 23 may be formed of the same semiconductor material as that of the first semiconductor layer 33. The second semiconductor layer 34b preferably has an energy band gap smaller than those of the first semiconductor layer 33 and the drain region 23. When the driving carrier of the device is electron and the excess carrier to be stored in the quantum well is a hole, it is preferably to select the material of the first and second semiconductor layers 33 and 34b and the drain 20 so that the energy bandgap difference is caused by a large valence-band offset (VBO).

If the semiconductor material satisfies the energy band gap condition, the first and second semiconductor layers 33 and 34b may be formed with any of semiconductor material. As a specific example, the first semiconductor layer 33 may be a silicon carbon layer having the same conductivity type as the source region 10, and the second semiconductor layer 34b may be a silicon layer having the opposite conductivity type to the first semiconductor layer 33.

The gate insulating layers 42 and 44 may be formed of a high dielectric material having a higher dielectric constant than silicon oxide film $SiO_2$ such as hafnium oxide $H_fO_2$.

Figure 16:
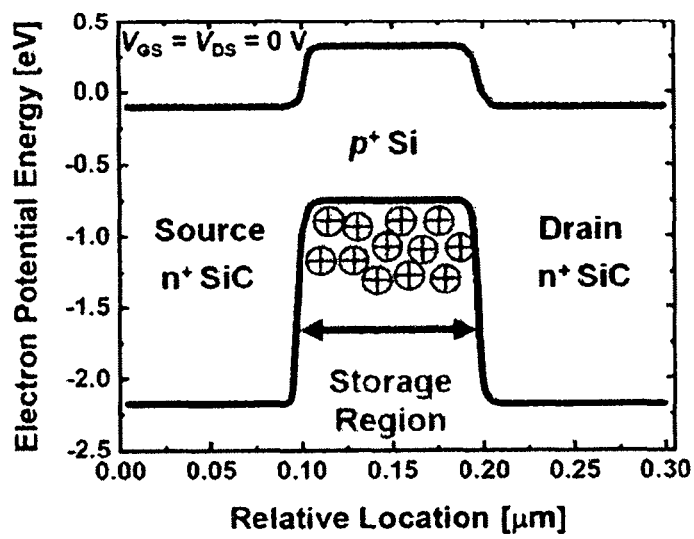
FIGS. 16 and 17 are electrical characteristic diagrams obtained as a result of the simulation of the structure of the 1T DRAM cell device shown in FIG. 7.

FIG. 16 is an energy band diagram of a more specific embodiment, wherein the first semiconductor layer 33 is an $n^+$ silicon carbon layer as a source extension region, the second semiconductor layer 34b is $p^+$ silicon layer, and the drain region 20 is $n^+$ silicon carbon layer. In this case, a quantum well is formed as a hole storage region in the $p^+$ silicon layer adjacent to the drain region 20.

According to FIG. 16, a quantum well for storing holes is deeply formed by a large valence-band offset between an $n^+$ silicon carbon layer and a $p^+$ silicon layer. In this embodiment, the retention characteristics and the read margin can be significantly improved compared to the general Si devices forming the channel region using only silicon.

Figure 17:
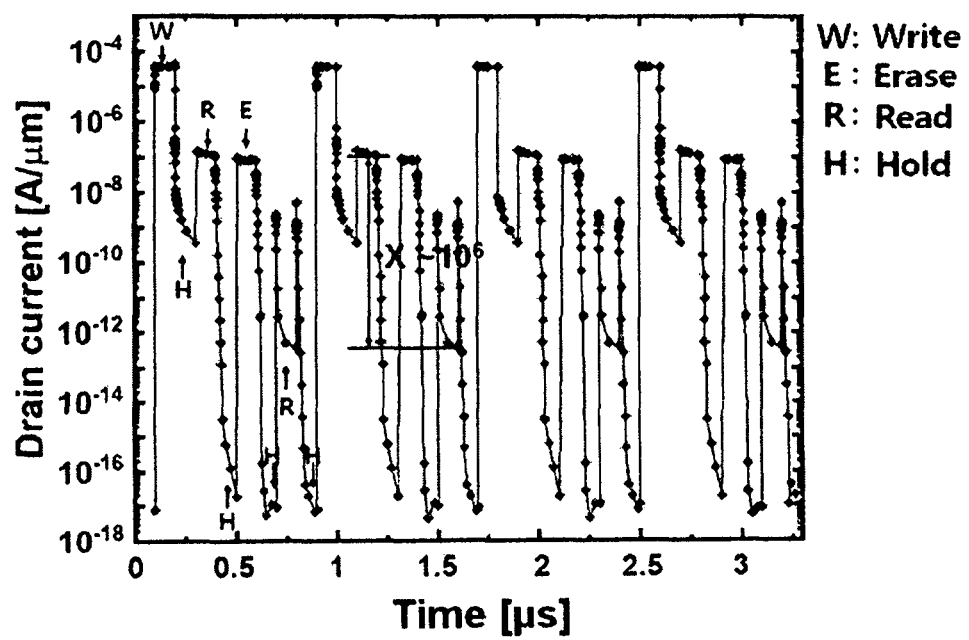

FIG. 17 illustrates a basic memory operation of the device having the structure of FIG. 16, and it shows that a read margin of about $10^6$ times is maintained even if the operation cycle is repeated.

Seventh Embodiment

Figure 8:
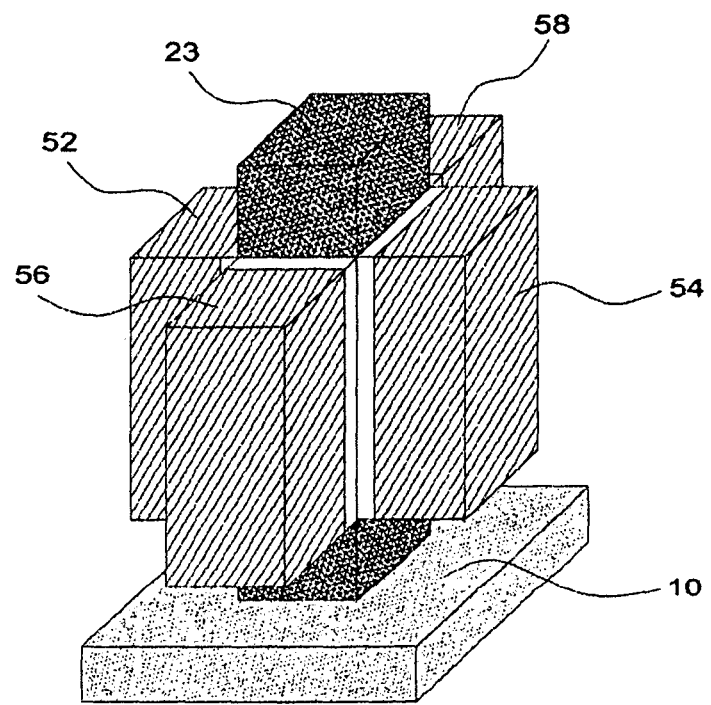
FIG. 8 is a cross-sectional view illustrating a structure of a 1T DRAM cell device according to a seventh embodiment of the present invention.

In the 1T DRAM cell device according to the seventh embodiment of the present invention, as shown in FIG. 8, the body region 30 of the sixth embodiment is formed on the source region 10 in a square pillar shape. Four gates 52, 54, 56, and 58 are circumferentially spaced apart on the side of the square pillar. As mentioned in the first embodiment, the shape of the body region 30 is not limited to the square pillar shape, and the gate is not limited to four gates.

Because at least one of the four gates 52, 54, 56, and 58 may be used as a hold gate (i.e., a retention gate) to maintain the charge in the quantum well formed in the body region 30, it can dramatically increase retention time and read current margin, and can drive as a memory device even in harsh environments with high temperature.

The rest of the configuration and application examples are the same as those of the first and sixth embodiments described above.

Each of the embodiments described above can be driven by GIDL, band-to-band tunneling, etc. due to two or more heterojunction surfaces perpendicular to the channel length direction and quantum wells formed by the heterojunction surfaces in the drain region. As a result, it is possible to drive with a low voltage (1 V or less) and high-speed operation (5-7 ns write/erase and 10 ns read).

In addition, the channel thickness can be scaled down to 10 nm without retention time degradation, and the quantum wells are formed adjacent to the drain region, which is comparable to or more excellent long retention time (1 s or more) and larger read current margin ($10^6$ or more) than those of a conventional DRAM cell.

Furthermore, since a heterojunction surface can be formed by vertically stacking epitaxial layers on a semiconductor substrate such as silicon, the conventional CMOS process technology can be used, and the area occupied by the device can be reduced as much as possible without limiting the channel length.

This work was supported by the Ministry of Trade, Industry and Energy (MOTIE) with the Korea Semiconductor Research Consortium (KSRC) support program for the development of the future semiconductor devices under Grants 10080513 and 10052928.

What is claimed is:

1. A 1T DRAM cell device, comprising:
a body region connecting a source region and a drain region and storing charge, and at least two gates formed on the body region with gate insulating layers interposed between the respective gates and the body region, wherein
the body region has a first semiconductor layer and a second semiconductor layer formed in a channel length direction with a first heterojunction surface between the first and second semiconductor layers, the first heterojunction surface being perpendicular to the channel length direction,
the first semiconductor layer is formed of the same semiconductor material as that of the source region and has a homojunction with the source region,
the second semiconductor layer is formed of a semiconductor material different from the drain region to be in contact with a second heterojunction surface perpendicular to the channel length direction,
the charge is stored in a quantum well formed by the first heterojunction surface and the second heterojunction surface in the second semiconductor layer,
the at least two gates cover the first heterojunction surface and the second heterojunction surface and are spaced apart from the source region by a predetermined distance, and
the first semiconductor layer is a silicon layer having a conductivity type opposite to that of the source region, and the second semiconductor layer is a silicon germanium layer doped with a higher concentration than the first semiconductor layer in the same conductivity type as the first semiconductor layer.

2. The 1T DRAM cell device of claim 1, wherein the silicon layer is formed of a bulk silicon substrate together with the source region.

* * * * *